(12) United States Patent
Hofer et al.

(10) Patent No.: US 11,639,967 B2
(45) Date of Patent: May 2, 2023

(54) SENSOR SYSTEM FOR A BATTERY MODULE

(71) Applicant: Samsung SDI Co., Ltd., Yongin-si (KR)

(72) Inventors: Maximilian Hofer, Hartberg (AT); Markus Pretschuh, Graz (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 17/032,240

(22) Filed: Sep. 25, 2020

(65) Prior Publication Data

US 2021/0141020 A1    May 13, 2021

(30) Foreign Application Priority Data

Nov. 12, 2019  (EP) .................................... 19208572
Sep. 11, 2020  (KR) ........................ 10-2020-0117057

(51) Int. Cl.
*G01R 31/36* (2020.01)
*G01R 31/382* (2019.01)
*G01R 31/374* (2019.01)

(52) U.S. Cl.
CPC ....... *G01R 31/3644* (2013.01); *G01R 31/374* (2019.01); *G01R 31/382* (2019.01)

(58) Field of Classification Search
CPC .............. G01R 31/3644; G01R 31/382; G01R 31/374; G01R 15/146; G01R 15/144;

(Continued)

(56) References Cited

U.S. PATENT DOCUMENTS

| 5,457,318 A | 10/1995 | Robinson et al. |
| 2003/0011355 A1 | 1/2003 | Skerritt et al. |

(Continued)

FOREIGN PATENT DOCUMENTS

| DE | 38 19 370 A1 | 12/1989 |
| DE | 10 2006 006 328 A1 | 8/2006 |

(Continued)

OTHER PUBLICATIONS

EPO Extended Search Report dated Apr. 22, 2020, for corresponding European Patent Application No. 19208572.8 (6 pages).

(Continued)

*Primary Examiner* — Lee E Rodak
*Assistant Examiner* — Trung Q Nguyen
(74) *Attorney, Agent, or Firm* — Lewis Roca Rothgerber Christie LLP

(57) ABSTRACT

A sensor system for a battery module, includes: a shunt resistor including: a first current clamp and a second current clamp, each of the first and second current clamps to be connected to a current path of the battery module; a first voltage clamp and a second voltage clamp; and a measurement resistance between the first voltage clamp and the second voltage clamp, and electrically connected to the first current clamp and the second current clamp; a first landing pad electrically connected to the first voltage clamp; a second landing pad electrically connected to the second voltage clamp; a first temperature sensor connected to the first landing pad; and a second temperature sensor connected to the second landing pad.

15 Claims, 6 Drawing Sheets

(58) Field of Classification Search
CPC ...... G01R 31/385; G01R 1/203; G01R 19/32; G01K 7/24; H01M 10/48; Y02E 60/10
USPC ..... 324/400–437, 415–444, 500, 522, 76.11, 324/76.39, 98, 120
See application file for complete search history.

(56) References Cited

U.S. PATENT DOCUMENTS

| | | |
|---|---|---|
| 2011/0089931 A1 | 4/2011 | Podlisk et al. |
| 2012/0229247 A1 | 9/2012 | Yoshioka |
| 2013/0004811 A1 | 1/2013 | Banerjee et al. |
| 2013/0328547 A1* | 12/2013 | Marten .................. G01R 1/203 324/126 |
| 2014/0015515 A1 | 1/2014 | Satou |
| 2015/0177291 A1 | 6/2015 | Kageyama et al. |
| 2017/0059632 A1 | 3/2017 | Parkman |
| 2018/0034207 A1* | 2/2018 | Czech ................. H01R 13/6315 |
| 2018/0328996 A1* | 11/2018 | Kimura ................ G01R 31/364 |
| 2019/0204367 A1 | 7/2019 | Frenzel et al. |

FOREIGN PATENT DOCUMENTS

| | | |
|---|---|---|
| WO | WO 2011/068205 A1 | 6/2011 |
| WO | WO 2015/162267 A1 | 10/2015 |

OTHER PUBLICATIONS

EPO Office Action dated Apr. 26, 2022, issued in corresponding European Patent Application No. 19208572.8 (4 pages).
Korean Office Action dated Jul. 6, 2022, issued in corresponding Korean Patent Application No. 10-2020-0117057 (7 pages).

* cited by examiner

SENSOR SYSTEM FOR A BATTERY MODULE

CROSS-REFERENCE TO RELATED APPLICATION

This application claims priority to and the benefit of European Patent Application No. 19208572.8, filed in the European Patent Office on Nov. 12, 2019, and Korean Patent Application No. 10-2020-0117057, filed in the Korean Intellectual Property Office on Sep. 11, 2020, the entire content of each of which is incorporated herein by reference.

1. Field

Aspects of example embodiments of the present disclosure relate to a battery system for a battery module, and more particularly, to a sensor system for measuring a current of a battery system.

2. Description of Related Art

A rechargeable or secondary battery may differ from a primary battery in that a rechargeable or secondary battery may be repeatedly charged and discharged, while the primary battery may provide an irreversible conversion of chemical to electrical energy. Low-capacity rechargeable batteries may be used as a power supply for small electronic devices, such as cellular phones, notebook computers, camcorders, and the like, while high-capacity rechargeable batteries may be used as a power supply for hybrid vehicles and the like.

In general, rechargeable batteries include an electrode assembly including a positive electrode, a negative electrode, and a separator interposed between the positive and negative electrodes, a case for receiving the electrode assembly, and an electrode terminal electrically connected to the electrode assembly. An electrolyte solution is injected into the case in order to enable charging and discharging of the battery via an electrochemical reaction of the positive electrode, the negative electrode, and the electrolyte solution. The shape of the case (e.g., which may be cylindrical or rectangular) depends on the battery's intended purpose. Lithium-ion (and similar lithium polymer) batteries, which are widely known via their use in laptops and consumer electronics, dominate the most recent group of electric vehicles in development.

Rechargeable batteries may be used as a battery module formed of a plurality of battery cells connected in series and/or in parallel so as to provide a high energy density (e.g., for motor driving of a hybrid vehicle). In other words, the battery module is formed by interconnecting the electrode terminals of the plurality of battery cells depending on a required amount of electric power, and in order to realize a high-power rechargeable battery (e.g., which may be used for an electric vehicle).

The above information disclosed in this Background section is for enhancement of understanding of the background of the invention, and therefore, it may contain information that does not constitute prior art.

DESCRIPTION OF THE DISCLOSURE

One or more example embodiments of the present disclosure are directed to a sensor system for a battery module, and more particularly, to a measurement system for measuring a current within or of the battery module. The sensor system may include a shunt resistor and thermoelectric effects on the shunt resistor may be taken into consideration.

According to one or more example embodiments of the present disclosure, a sensor system for a battery module, includes: a shunt resistor including: a first current clamp and a second current clamp, each of the first and second current clamps being configured to be connected to a current path of the battery module; a first voltage clamp and a second voltage clamp; and a measurement resistance between the first voltage clamp and the second voltage clamp, and electrically connected to the first current clamp and the second current clamp; a first landing pad electrically connected to the first voltage clamp; a second landing pad electrically connected to the second voltage clamp; a first temperature sensor connected to the first landing pad; and a second temperature sensor connected to the second landing pad.

In an example embodiment, each of the first current clamp and the second current clamp may include at least one contact hole configured to connect to a terminal of a battery cell.

In an example embodiment, the measurement resistance may include Manganin, Isotan, Constantan, and/or Isabellin.

In an example embodiment, the first and second current clamps and the first and second voltage clamps may include copper or aluminum.

In an example embodiment, the sensor system may further include: a circuit carrier configured to carry a controller of the battery module. The first landing pad and the second landing pad may be conductive structures on a surface of the circuit carrier, the shunt resistor may be on the surface of the circuit carrier, and the first and second temperature sensors may be surface mounted to the surface of the circuit carrier.

In an example embodiment, the circuit carrier may be configured to carry at least one of a cell supervision circuit, a cell connecting unit, a battery management unit, or a battery management system.

In an example embodiment, the first temperature sensor may be a first thermistor, and the second temperature sensor may be a second thermistor.

In an example embodiment, the first current clamp may be configured as a first bar element, the second current clamp may be configured as a second bar element, and the measurement resistance may be configured as a third bar element connected to the first bar element and the second bar element to form a common bar extending in a lengthwise direction.

In an example embodiment, the first voltage clamp may be a first protrusion extending from the first bar element in a direction angled to the lengthwise direction, and the second voltage clamp may be a second protrusion extending from the second bar element in a direction angled to the lengthwise direction.

In an example embodiment, the first voltage clamp may be connected to a first voltage sensing line via the first landing pad, and to a first temperature sensing line via the first landing pad and the first temperature sensor; and the second voltage clamp may be connected to a second voltage sensing line via the second landing pad, and to a second temperature sensing line via the second landing pad and the second temperature sensor.

In an example embodiment, a thermal coupling between the first and second landing pads and at least one of the first and second voltage sensing lines or the first and second temperature sensing lines, respectively, may be decreased.

In an example embodiment, at least one of the first and second voltage sensing lines or the first and second temperature sensing lines may have a local thinning portion to decrease the thermal coupling.

In an example embodiment, the first and second voltage sensing lines may be configured to provide voltage signals to a voltage measurement circuit, and the first and second temperature sensing lines may be configured to provide temperature signals to a temperature measurement circuit.

In an example embodiment, a reference voltage node may be connected to the first temperature sensing line via a first resistor, and/or to the second temperature sensing line via a second resistor.

In an example embodiment, the voltage measurement circuit and the temperature measurement circuit may be configured to communicate with each other.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION OF THE DRAWINGS

Figure 1A:
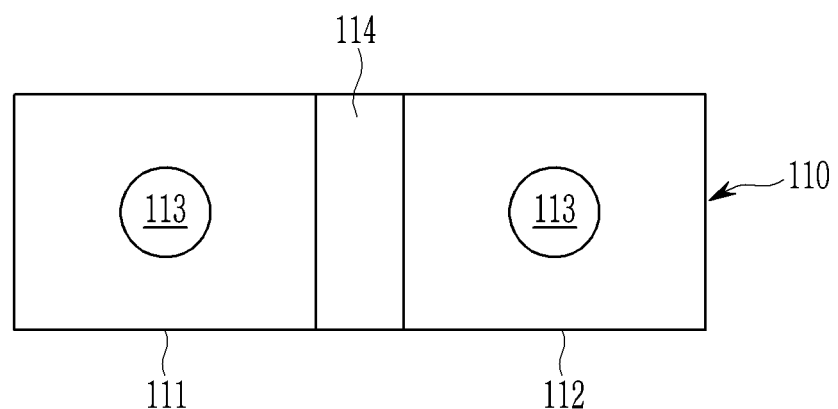
FIG. 1A schematically illustrates a shunt resistor.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has, " "have, " and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. For example, if the term "substantially" is used in combination with a feature that could be expressed using a numeric value, the term "substantially" may denote a range of +/−5% of the value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
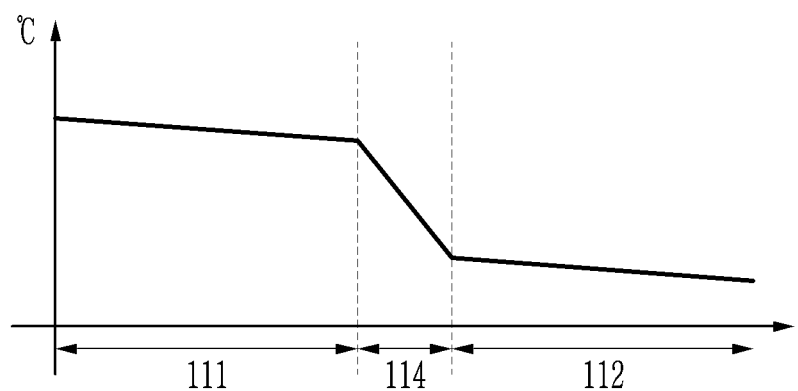
FIG. 1B illustrates a graph showing a temperature profile along the shunt resistor of FIG. 1A.

FIG. 1A schematically illustrates a shunt resistor, and FIG. 1B illustrates a graph showing a temperature profile along the shunt resistor of FIG. 1A.

For meeting the dynamic power demands of various different electrical consumer devices connected to the battery system, a static control of battery power output and charging may not be sufficient. Thus, steady exchange of information between the battery system and the controllers of the electrical consumer devices may be desired. This information includes the battery system's actual state of charge (SoC), potential electrical performance, charging ability, and internal resistance, as well as actual or predicted power demands or surpluses of the electric consumer devices.

Battery systems usually include a battery management system (BMS) and/or battery management unit (BMU) for processing the aforementioned information. The BMS/BMU may communicate with the controllers of the various different electrical consumer devices via a suitable communication bus (e.g., such as a Serial Peripheral Interface (SPI) or a Controller Area Network (CAN) interface). The BMS/BMU may further communicate with each of the battery modules (or battery sub-modules), particularly with a cell supervision circuit (CSC) of each battery module (or battery sub-module). The CSC may be further connected to a cell connection and sensing unit (CCU) of a battery module (or battery sub-module) that interconnects the battery cells thereof. The CCU may further provide a voltage sensing signal of one or more battery cells of the battery module (or battery sub-module), and may process such voltage sensing signal itself or provide the voltage sensing signal to the CSC.

A Lithium ion battery system usually monitors a voltage of the battery cells, as over and/or undervoltage may pose a security risk, and may lower the service life of the system. Further the current of the battery system may be detected in order to derive the actual SOC (e.g., by current-time-integration). Generally, in a method for measuring the battery current, a shunt may be introduced with precisely known small ohmic resistance in the current path of the battery system. By measuring the voltage drop over the shunt, the current may be determined using the known resistance. As the voltage drop over the shunt may preferably be small, a highly accurate voltage detection system may be desired, and thus, may usually be realized on the CCU and/or the CSC.

Usual shunt resistors utilized for measuring currents occurring in battery systems may include two current clamps that are configured to be respectively connected to the current path in which a current is measured. The two current clamps of the shunt resistor are connected by the actual measurement resistance, which is usually formed by a suitable alloy, for example, such as e.g., Manganin®, Isotan®, or the like. Because the current clamps are not formed of the cost-intensive alloy of the measurement resistance, but are usually formed of copper, aluminum, or the like, a thermoelectric effect may occur along the different components of the shunt resistor.

As different metals are used for forming the shunt resistor, the thermoelectric effect of these metals may negatively and significantly impact the current measurement results. For example, as shown in FIG. 1A, a shunt resistor 110 may be used for current measurements via voltage sensing. The shunt resistor 110 of FIG. 1A includes a first current clamp 111 and a second current clamp 112, which are each formed of metal. Each of the first current clamp 111 and the second current clamp 112 includes a hole 113 for being connected to a current path, and more particularly, for being connected to column shaped terminals of the battery cells. The first and second current clamps 111 and 112 are connected to each other via a measurement resistance 114 formed of Manganin®. By measuring a voltage drop across the shunt resistor 110, and more particularly, across the measurement resistance 114, the current across the shunt resistor 110 may be determined. In order to avoid influence of transition resistances at the connections to the battery module, the voltages may be measured directly adjacent to the measurement resistance 114 (e.g., via wire bonds connected to a measurement circuit).

As further shown in FIG. 1B, the temperature at the first current clamp 111 may significantly exceed the temperature at the second current clamp 112. This temperature step may have different reasons, for example, such as a relay that is positioned adjacent to the first current clamp 111 and that inputs additional heat to the first current clamp 111. Further, adjacent to the second current clamp 112 a connection to a vehicle or to another heat sink may be formed that may significantly lower the temperature of the second current clamp 112. The largest temperature gradient may be formed in the measurement resistance 114 due to the high thermal resistance of the alloy used to form the measurement resistance 114.

If the temperature gradient over the shunt resistor 110 is known, the thermoelectric effect may be compensated by calculation in determining the current from the voltage measurement. However, thermal coupling between a temperature sensor element and a shunt resistor 110 may be complex as the shunt resistor 110 is usually mounted to a circuit carrier, such as a printed circuit board (PCB), or directly to a battery module. Temperature sensors are often mounted via a thermal glue to a shunt resistor, which may be an expensive and complex process that may also be difficult to integrate in the production of battery electronic systems.

According to one or more example embodiments of the present disclosure, a sensor system is provided for current measurements that considers thermal effects and that may be easily integrated in control units (e.g., controllers) for battery systems.

In brief overview, the sensor system according to one or more example embodiments of the present disclosure may include a shunt resistor including a first current clamp and a second current clamp, the first current clamp and the second current clamp being each configured to be connected to a current path of the battery module. In other words, the shunt resistor is configured to be integrated in a current path of the battery module, and a current may be measured along the current path. The shunt resistor is integrated in the current path by connecting the first current clamp and the second current clamp thereto. In an embodiment, the shunt resistor further includes a first voltage clamp and a second voltage clamp. The first and second voltage clamps are configured to tap the voltage signals from the shunt resistor (e.g., for providing the voltage signals to a voltage measurement circuit).

The shunt resistor of the sensor system of one or more example embodiments of the present disclosure may further include a measurement resistance that is electrically connected to the first current clamp and the second current clamp. In other words, the measurement resistance is disposed between the first current clamp and the second current clamp, and may also be mechanically connected to the first and second current clamps. The measurement resistance has an ohmic resistance of a desired value (e.g., a predetermined or precisely defined value). For example, the measurement resistance may have an ohmic resistance that is adapted to the magnitude of the current to be measured. Typical measurement resistances used in battery modules have an ohmic resistance of 100 µΩ. However, due to the increasing currents of modern battery modules, the measurement resistance may also have an ohmic resistance that is less than (e.g., that is smaller than) 100 µΩ, for example, an ohmic resistance of 50 µΩ or 25 µΩ. The measurement resistance is disposed in between the first voltage clamp and the second voltage clamp, wherein the first and second voltage clamps are positioned adjacent to the measurement resistance. For example, the voltage clamps may be positioned directly adjacent to the measurement resistance. Thus, the measurement resistance may also be electrically connected to (e.g., and in some embodiments, may also be mechanically connected to) the first voltage clamp and the second voltage clamp. However, additional (e.g., electrically insulating) mechanical connection means may also be used.

The sensor system according to one or more example embodiments of the present disclosure may further include a first landing pad that is electrically connected to the first voltage clamp, and a second landing pad that is electrically connected to the second voltage clamp. Thus, the first landing pad may be configured to receive a first voltage signal from the first voltage clamp (e.g., that is at the same or substantially the same electric potential as that of the first voltage clamp). The second landing pad may be configured to receive a second voltage signal from the second voltage clamp (e.g., that is at the same or substantially the same electric potential as that of the second voltage clamp). The landing pads may be contact pads that are electrically connected to the voltage clamps. In an embodiment, the landing pads are separate from and independent of the shunt resistor. For example, the landing pads may not constitute a part of the shunt resistor.

The sensor system according to one or more example embodiments of the present disclosure may further include a first temperature sensor that is connected to the first landing pad, and a second temperature sensor that is connected to the second landing pad. The first temperature sensor may be configured to measure a temperature of the first landing pad, and may further be at the same or substantially the same temperature as that of the first landing pad (e.g., at least in a thermal equilibrium). The second temperature sensor may be configured to measure a temperature of the second landing pad, and may further be at the same or substantially the same temperature as that of the second landing pad (e.g., at least in a thermal equilibrium).

According to one or more example embodiments of the present disclosure, a sensor system for a battery module is provided that allows for current measurements in the battery module under consideration of thermal effects. Particularly, the sensor system provides a simple solution for measuring a temperature drop along (e.g., across) a shunt resistor, in addition to a voltage drop along (e.g., across) the shunt resistor. Thus, the sensor system allows for highly precise current measurements via the shunt resistor.

According to one or more example embodiments of the present disclosure, an excellent thermal coupling between temperature sensors and the shunt may be realized by coupling the temperature sensors to the landing pads (e.g., the contact pads) for the voltage clamps of the shunt resistor. These landing pads may be provided for tapping the voltage signals from the shunt resistor when measuring the voltage drop over the measurement resistance in order to determine the current through the shunt. Thus, no additional structures may be required for thermally connecting (e.g., thermally coupling) the temperature sensors to the shunt, and also the entire sensor system may be surface mounted.

According to an embodiment of the present disclosure, a sensor system is provided wherein the first current clamp and the second current clamp each includes at least one contact hole that is configured for being connected to a terminal of at least one battery cell. For example, each of the contact holes may be configured to be fit onto a column-shaped or cylindrical-shaped terminal of a battery cell. In other words, the shunt resistor may be configured as a busbar for connecting cell terminals of at least two battery cells. In an embodiment, the shunt resistor is part of a cell connecting unit (CCU), or a cell supervision circuit (CSC) mounted on top of a battery module. Further, the shunt resistor may be a busbar electrically connecting the cell terminals of two battery cells electrically connected in series within the battery module. In an embodiment, each contact hole is configured for allowing a tool to be inserted there through (e.g., a tool for welding the respective current clamp to a terminal of at least one battery cell). In an embodiment, the contact holes may improve heat dissipation from the shunt resistor.

In an embodiment, the first current clamp is configured to be electrically connected to at least one first cell terminal of a first polarity, and the second current clamp is configured to be electrically connected to an equal or substantially equal amount of second cell terminals of a second polarity. In an embodiment, the current clamps are adapted in material, size, and shape to the respective battery cell terminals to which they are to be connected. The first current clamp and the second current clamp may be configured to be connected to one or more of the respective cell terminals. For example, the respective current clamps are configured to be connected to a plurality of terminals of battery cells connected in parallel.

In an embodiment, the first current clamp includes the same or substantially the same material as that of the first cell terminals of the first polarity. Thus, bimetallic corrosion may be avoided. For example, the material of the entire first current clamp or only of a contact region configured to contact (e.g., to directly contact) the first terminal(s) may be adapted to the material (e.g., may have the same or substantially the same material as that) of the first terminal(s). In an embodiment, the second current clamp may include the same or substantially the same material as that of the second cell terminals of the second polarity. Thus, bimetallic corrosion may be avoided. For example, the material of the entire second current clamp or only of a contact region configured to contact (e.g., to directly contact) the second terminal(s) may be adapted to the material (e.g., may have the same or substantially the same material as that) of the second terminal(s). However, the first current clamp and the second current clamp may also be formed of the same or substantially the same material as each other, for example, such as copper or aluminum.

In an embodiment, the measurement resistance may include (or may be formed of) Manganin, Constantan, Isotan, Isabellin, and/or another suitable material having a thermally stable ohmic resistance. In an embodiment, the voltage clamps are of the same or substantially the same material as that of the respective current clamp. For example, the first voltage clamp is of the same or substantially the same material as that of the first current clamp, and the second voltage clamp is of the same or substantially the same material as that of the second current clamp. In an embodiment, the first and second voltage clamps include copper or aluminum.

In an embodiment of the present disclosure, the sensor system further includes a circuit carrier that is configured for carrying a control unit (e.g., a controller) of the battery module. The circuit carrier may be a rigid circuit board, a flexible circuit board (FCB), or a combination thereof. The rigid circuit carrier may include a plurality of conductive structures, for example, formed as metallization or from conductive polymer, and thus, may be a printed circuit board (PCB). The flexible circuit board may also include a plurality of conductive structures formed as metallizations or from conductive polymers, and thus, may be a flexible printed circuit (FPC).

According to an embodiment, the first landing pad and the second landing pad are formed as conductive structures on a surface of the circuit carrier. The conductive structures may be metallizations or may be formed from conductive polymers. Further, the surface may be a first main surface of a flat and extended planar circuit carrier. According to this embodiment, the shunt resistor is mounted to the surface (e.g., the first main surface) of the circuit carrier. In other words, the shunt resistor is mechanically affixed to the surface (e.g., the first main surface), and the voltage clamps of the shunt resistor are electrically (e.g., and thermally) connected to the respective landing pads on the first main surface. In an embodiment, the first and second voltage clamps of the shunt resistor are soldered, welded, or wire-bonded to a respective landing pad.

In an embodiment, the temperature sensors are surface mounted to the surface (e.g., the first main surface) of the circuit carrier. In other words, according to this embodiment, the shunt resistor, the landing pads, and the temperature sensors are configured as surface mounted devices (SMDs). The first and second temperature sensors may be electrically and thermally connected to the respective landing pad. This embodiment may allow for a particularly easy assembling and mounting of the sensor system using standard processes of microelectronic engineering.

In an embodiment, the first temperature sensor of the sensor system may be a first thermistor, and the second temperature sensor of the sensor system may be a second thermistor. In an embodiment, the temperature sensors may be either negative temperature coefficient (NTC) thermistors or positive temperature coefficient (PTC) thermistors. In this example, both the first and second temperature sensors may be of the same kind. This embodiment utilizes the combined thermal and electric connection of the temperature sensors to the respective landing pad of the sensor system. However, the present disclosure is not limited thereto, and the sensor system may also be realized with other kinds of temperature sensors. For example, any suitable kind of temperature sensor may benefit from the thermal coupling between the voltage clamps of the shunt resistor and the metallization of the respective landing pad.

According to an embodiment of the present disclosure, the first current clamp is configured as a first bar element, and the second current clamp is configured as a second bar element. In other words, each of the first and second current clamps may be configured as a planar flat or substantially flat component. In this example, the measurement resistance may be configured as a third bar element that is connected to the first bar element and the second bar element. According to this embodiment, the first and second bar elements, for example, the first and second current clamps, together with the third bar element, for example, the measurement resistance, may form a common bar that extends in a lengthwise direction. Thus, the shunt resistor of this embodiment may be simple to manufacture and to handle in a battery module assembly.

According to this embodiment, the first voltage clamp is formed as a first protrusion that extends from the first bar element in a direction angled to the lengthwise direction, for example, such as in a direction perpendicular to the lengthwise direction. Further, the second voltage clamp may be formed as a second protrusion that extends from the second bar element in a direction angled to the lengthwise direction, for example, such as in a direction perpendicular to the lengthwise direction. In this example, providing additional voltage clamps may increase the measurement accuracy, as transition resistances at the contact points of the current clamps and the current path, which may exceed the measurement resistance, may interfere less with the voltage measurements. Further, voltage clamps formed by angled protrusions may simplify the electric and thermal connection of these voltage clamps to the landing pads of the system.

According to an embodiment of the sensor system of the present disclosure, the first voltage clamp may be connected via the first landing pad to a first voltage sensing line. In this example, the first voltage sensing line is configured to receive a first voltage signal via the first landing pad from the first voltage clamp. The first voltage signal may be indicative of a voltage (e.g., an electric potential) at the first voltage clamp. The first voltage line is a conductive structure on the surface (e.g., the first main surface) of the circuit board, and may be formed as a metallization or may be formed of conductive polymer. The first voltage line may be further configured to transmit the received first voltage signal to a voltage measurement circuit that may be disposed on the circuit board. Further, the first voltage clamp may be connected via the first landing pad and the first temperature sensor to a first temperature sensing line. The first temperature sensing line may be configured to receive a first temperature signal from the first temperature sensor, and the first temperature signal may be indicative of the temperature of the first voltage clamp. The first temperature sensing line may be further configured to transmit the first temperature signal to a temperature measurement circuit (e.g. on the circuit board).

According to an embodiment of the sensor system of the present disclosure, the second voltage clamp is connected via the second landing pad to a second voltage sensing line. The second voltage sensing line may be configured to receive a second voltage signal via the second landing pad from the second voltage clamp. The second voltage signal may be indicative of a voltage (e.g., an electric potential) at the second voltage clamp. The second voltage line is a conductive structure on the surface (e.g., the first main surface) of the circuit board, and may be formed as a metallization or formed of a conductive polymer. The second voltage line may be further configured to transmit the received second voltage signal to a voltage measurement circuit that may be disposed on the circuit board. Further, the second voltage clamp may be connected via the second landing pad and the second temperature sensor to a second temperature sensing line. The second temperature sensing line is configured to receive a second temperature signal from the second temperature sensor, and the second temperature signal may be indicative of the temperature of the second voltage clamp. The second temperature sensing line may be further configured to transmit the second temperature signal to a temperature measurement circuit (e.g., on the circuit board). In this embodiment, the first and second temperature sensor may both be thermistors.

In the embodiment described above, a thermal coupling between the first landing pad and at least one of the first voltage sensing line and the first temperature sensing line may be decreased (e.g., may be limited or lowered). Further, a thermal coupling between the second landing pad and at least one of the second voltage sensing line and the second temperature sensing line may be decreased (e.g., may be limited or lowered). The sensing lines are configured to transmit respective signals (e.g., electric signals) to respective measurement circuits. As electric conductivity corresponds to (e.g., comes along with) thermal conductivity, the landing pads are thus also thermally connected to the respective measurement circuits. However, in order to limit the thermal influence of these measurement circuits on the landing pads, for example, in order to increase the accuracy of the temperature measurement at the landing pads, the thermal coupling of at least some of the sensing lines and the respective landing pads may be decreased.

In an embodiment, the thermal coupling of the landing pads from the respective sensing lines is decreased (e.g., is lowered or limited) by at least a local thinning of the voltage sensing lines and/or the temperature sensing lines. In other words, the thermally conductive cross section of the respective sensing lines may be decreased. For example, the thinning is disposed adjacent to the respective landing pad. A local thinning may reduce the thermally conductive cross section of a sensing line along a fraction (e.g., along a portion) of the extension of the sensing line. However, the present disclosure is not limited thereto, and the thinning may also extend along the entire extension of the sensing line, such that the entire sensing line may be dimensioned such that thermal propagation along the sensing line is negligible. A reduction of thermal coupling by at least a local thinning of a sensing line may be simple to realize in common structuring methods of microelectronic structures, for example, by photolithographic techniques.

As set forth above the first and second voltage sensing lines are configured to receive a respective first and second voltage signal, Sens+ and Sens−, from the respective first and second landing pads. The first and second voltage sensing lines are further configured to provide the first and second voltage signals to at least one voltage measurement circuit. However, individual voltage measurement circuits may be used for the first and second voltage signals. For example, a single voltage measurement circuit may be disposed on the circuit board, and may be configured for receiving the first voltage signal and the second voltage signal. The at least one voltage measurement circuit is configured to determine a voltage value, for example, such as a digitally coded voltage value, based on the analogue first and second voltage signals. The voltage measurement circuit may receive at least one reference voltage, and may include at least one comparator, for example, such as a plurality of comparators.

The first and second temperature sensing lines are configured to receive first and second temperature signals, $TMP_1$ and $TMP_2$, from the respective first and second voltage sensors. The first and second temperature sensing lines are further configured to provide (e.g., to transmit) the first and second temperature signals to at least one temperature measurement circuit. However, individual temperature measurement circuits may be used for the first and second temperature signal. For example, a single temperature measurement circuit may be disposed on the circuit board, and may be configured for receiving the first temperature signal and the second temperature signal. The temperature measurement circuit is further configured to determine a temperature value, for example, such as a digitally coded voltage value, based on the analogue first and second temperature signals. The temperature measurement circuit may receive at least one reference voltage, and may include at least one operational amplifier, a comparator, for example, a plurality of comparators, and/or the like.

In the above described embodiment, the first and second temperature sensors may be configured as first and second thermistors. Thus, the first and second temperature signals may be obtained (e.g., may be easily obtained) as electric signals by applying a reference voltage to each of the first and second temperature sensors. The voltage on the respective temperature sensing line may then depend on the electric resistance of the first temperature sensor thermistor and the second temperature sensor thermistor, respectively, and these electric resistances may be dependent on the temperature of the respective first and second landing pads that are thermally and electrically connected to the first and second temperature sensors, respectively. Further, in this embodiment, a reference voltage node may be connected to the first temperature sensing line and to the second temperature sensing line. However, different reference voltage nodes may be connected to the first and second temperature sensing lines, respectively.

According to the above embodiment, the voltages on the temperature sensing lines depend on the reference voltage and the temperature-dependent resistance of the thermistors. These voltages on the temperature sensing lines are also connected via the landing pads to the shunt resistor, and thus, may cause an additional current trough the shunt resistor. As such additional current may interfere with the current measurement, the at least one reference voltage node may be connected via a first resistor to the first temperature sensing line and via a second resistor to the second temperature sensing line. The ohmic resistance of the first and second resistor may be set to limit (e.g., to significantly limit) the additional current based on the reference voltage over the shunt resistor, for example, such as a current of 500 µA or below. The first and second resistors may be connected in series with the shunt resistor, and thus, the additional current through the shunt resistor may be effectively limited. Further, each of the first and the second temperature sensors may be connected to ground via the shunt resistor.

According to the above embodiment, the voltage drop over the shunt resistor may also influence the temperature signals on the first and second temperature sensing lines due to the different reference voltages. These different reference voltages may contribute to a potential error in a temperature measurement, for example, if the difference is not considered during temperature determination based on the first and second temperature signal. Thus, the voltage measurement circuit and the temperature measurement circuit may be configured to communicate with each other.

For example, the voltage measurement circuit may inform the temperature measurement circuit about the voltage drop over the shunt resistor, such as over the measurement resistance, for enabling the temperature measurement circuit to account for different reference voltages applied to the temperature sensors.

In an embodiment, the circuit carrier of the sensor system may carry a cell supervision circuit (CSC) connected to the battery module, which may be configured to receive voltage and temperature signals for at least one battery cell of the battery module. The CSC may further be configured to process these signals and/or to perform active and/or passive balancing of the battery cells of the battery module. The CSC may further be configured to communicate with further CSCs and/or a battery management system (BMS). Further, the circuit carrier of the sensor system may carry or may be configured as a cell connecting unit (CCU) connected to the battery module, which may be configured for connecting at least one battery cell to a CSC. The CCU may include the circuit carrier, a plurality of landing pads, temperature sensing lines, and voltage sensing lines, as well as further mounting pads. Further, the circuit carrier may carry a battery management unit (BMU) or a BMS configured for performing high level control operations with respect to the battery module, for example, such as emergency shut-off of battery cells, battery modules (or sub modules), and/or the battery system, charging, SOC estimation, and communication with electrical loads connected to the BMS.

The above and other aspects and features of example embodiments of the present disclosure will now be described in more detail with reference to FIGS. 2 to 5.

Figure 2:
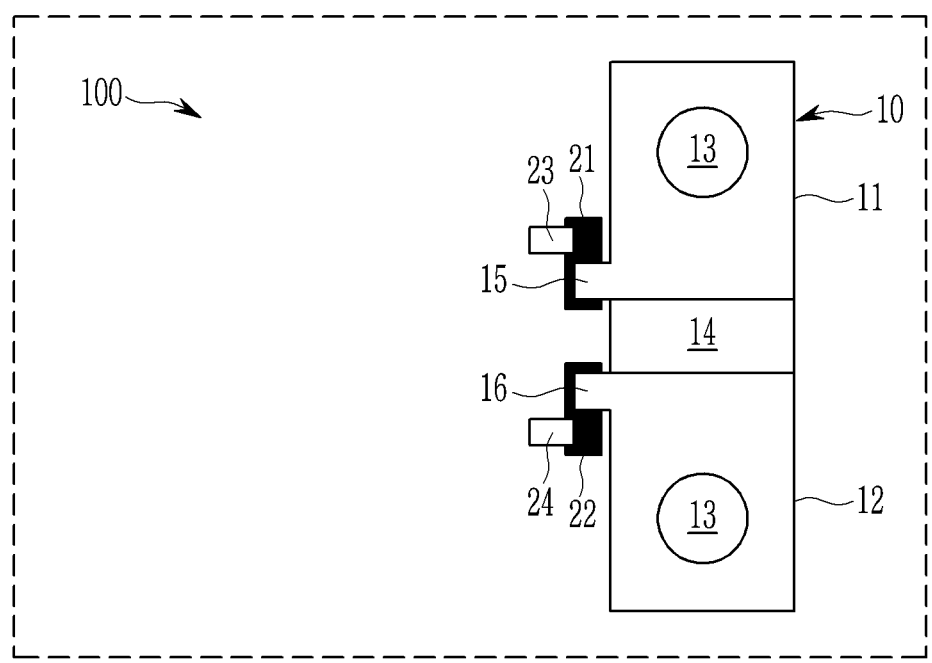
FIG. 2 schematically illustrates a sensor system according to an embodiment.

FIG. 2 schematically illustrates a sensor system 100 according to an embodiment of the present disclosure. The sensor system 100 includes a shunt resistor 10 that is configured to be integrated in (e.g., connected to) a current path, for example, in a current path of a battery module. The shunt resistor 10 includes a first current clamp 11 and a second current clamp 12, each including a contact opening 13. The first current claim 11 and the second current claim 12 may each be bar-shaped and may include (e.g., may be formed of) a metal (e.g., may each be a bar-shaped piece of the metal). The contact opening 13 is configured to facilitate the connection of the shunt resistor 10 to the current path, for example, such as to cell terminals of battery cells of the battery module. In this example, the cell terminal may be inserted through the contact opening 13, or a weld operation may be performed though the contact opening 13. The metal material of each of the first current clamp 11 and the second current clamp 12 may be adapted to (e.g., may be the same or substantially the same as) the material of the cell terminals.

The first current clamp 11 and the second current clamp 12 are separated (e.g., are spaced apart) from each other by a measurement resistance 14 that is disposed between the first current clamp 11 and the second current clamp 12. The measurement resistance 14 may be formed of Manganin, and may include an ohmic resistance (e.g., a predetermined or a precisely determined ohmic resistance) of 75 µΩ that is stable or substantially stable with respect to temperature changes. The shunt resistor 10 further includes a first voltage clamp 15 that protrudes from the first current clamp 11 in a direction perpendicular to or substantially perpendicular to a lengthwise direction of the shunt resistor 10. The lengthwise direction may refer to a direction extending from the first current clamp 11 over the measurement resistance 14 to the second current clamp 12. The shunt resistor 10 further includes a second voltage clamp 16 protruding from the second current clamp 12 in a direction perpendicular to or substantially perpendicular to the lengthwise direction of the shunt resistor 10.

The first voltage clamp 15 of the shunt resistor 10 is connected to a first landing pad 21 of the sensor system 100, and the second voltage clamp 16 is connected to a second landing pad 22 of the sensor system 100. Each of the first landing pad 21 and the second landing pad 22 may be a copper contact pad. The size of the first landing pad 21 may be greater than the size of the first voltage clamp 15. For example, the width of the first landing pad 21 in the lengthwise direction of the shunt resistor 10 may be greater than the width of the first voltage clamp 15 in the lengthwise direction. The size of the second landing pad 22 may be greater than the size of the second voltage clamp 16. For example, the width of the second landing pad 22 in the lengthwise direction may be greater than the width of the second voltage clamp 16 in the lengthwise direction of the shunt resistor 10.

When the size of the landing pads 21 and 22 are greater than the size of the respective voltage clamps 15 and 16, the connection of a first temperature sensor 23 to the first landing pad 21 and the connection of a second temperature sensor 24 to the second landing pad 22 may be improved (e.g., may be benefited). The temperature sensors 23 and 24 are thermally connected to the respective landing pads 21 and 22, and the respective landing pads 21 and 22 are thermally connected to the respective voltage clamps 15 and 16. Thus, the sensor system 100 according to the present embodiment of the present disclosure may allow accurate measurements of the temperatures of the voltage clamps 15 and 16, and thus, a measurement of the temperature gradient of the shunt resistor 10 may be improved without using or requiring a complicated bonding process of the temperature sensors 23 and 24.

Figure 3:
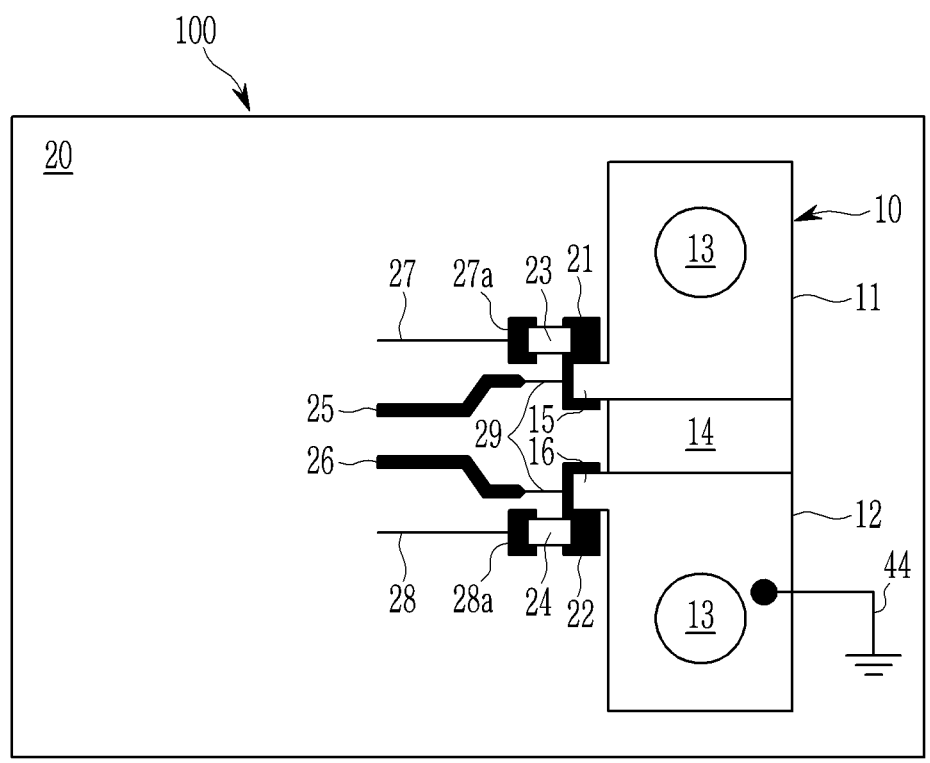
FIG. 3 schematically illustrates a sensor system according to another embodiment.

FIG. 3 schematically illustrates a sensor system 100 according to another embodiment. Referring to FIG. 3, the sensor system 100 further includes a circuit carrier 20 that is configured to carry the components of the sensor system 100 as surface mounted devices (SMDs). The circuit carrier 20 may be planar or substantially planar, and may include a first main surface as the surface shown in FIG. 3 (e.g., the surface facing the user), and a second main surface opposite the first main surface. The shunt resistor 10 is attached to (e.g., adhered to or mounted on) the first main surface with an insulating glue, and is connected to a current path of a battery module by the cell terminals of battery cells of the battery module inserted through the contact holes 13 and through corresponding holes of the circuit carrier 20 that are aligned with the holes 13.

According to the present embodiment, the first and second landing pads 21 and 22 are formed as copper surface metallizations on the first main surface of the circuit carrier 20. Further, a first voltage sensing line 25 is connected to the first landing pad 21, and a second voltage sensing line 26 is connected to the second landing pad 22. The first and second voltage sensing lines 25 and 26 are also formed as copper surface metallizations on the first main surface of the circuit carrier 20. A local thinning portion 29 is formed in each of the first and second voltage sensing lines 25 and 26 that are adjacent to the first and second landing pads 21 and 22 respectively. The local thinning portion 29 serves to decrease the thermal coupling between the voltage sensing lines 25 and 26 and the landing pads 21 and 22, respectively, by reducing the thermally conductive cross-section of the voltage sensing lines 25 and 26 adjacent to the first and second landing pads 21 and 22.

Further, a first temperature sensing line 27 is connected to the first temperature sensor 23 via a first sensor pad 27a, and a second temperature sensing line 28 is connected to the second temperature sensor 24 via a second sensor pad 28a. The temperature sensing lines 27 and 28 and the sensor pads 27a and 28a are also formed as copper surface metallizations on the circuit carrier 20. The cross-sections of the entire temperature sensing lines 27 and 28 correspond to the cross-section of the local thinning portion 29 in the first and/or second voltage sensing line 25 and/or 26, such that a thermal conductivity of the temperature sensing lines 27 and 28 may be negligible.

According to the present embodiment, the first voltage sensing line 25 taps a first voltage signal from the first landing pad 21, and the first voltage signal corresponds to the voltage potential at the first voltage clamp 15. Further, the second voltage sensing line 26 taps a second voltage signal from the second landing pad 22, and the second voltage signal corresponds to the voltage potential at the second voltage clamp 16. Thus, the combination of the first and second voltage signals is indicative of the voltage drop over the shunt resistor 10, and may be evaluated by a voltage measurement circuit including, for example, a differential amplifier and/or the like.

Further, according to the present embodiment, the first temperature sensing line 27 taps a first temperature signal from the first temperature sensor 23, and the second voltage sensing line 28 taps a second temperature signal from the second temperature sensor 24. Each of the first and second temperature signals may be an output of the respective temperature sensor 23 and 24, or may be a signal, for example, a voltage, influenced by the temperature sensors 23 and 24. Thus, the first temperature signal is indicative of the temperature at the first landing pad 21, and thus, at the first voltage clamp 15, and the second temperature signal is indicative of the temperature at the second landing pad 22, and thus, at the second voltage clamp 16.

Figure 5:
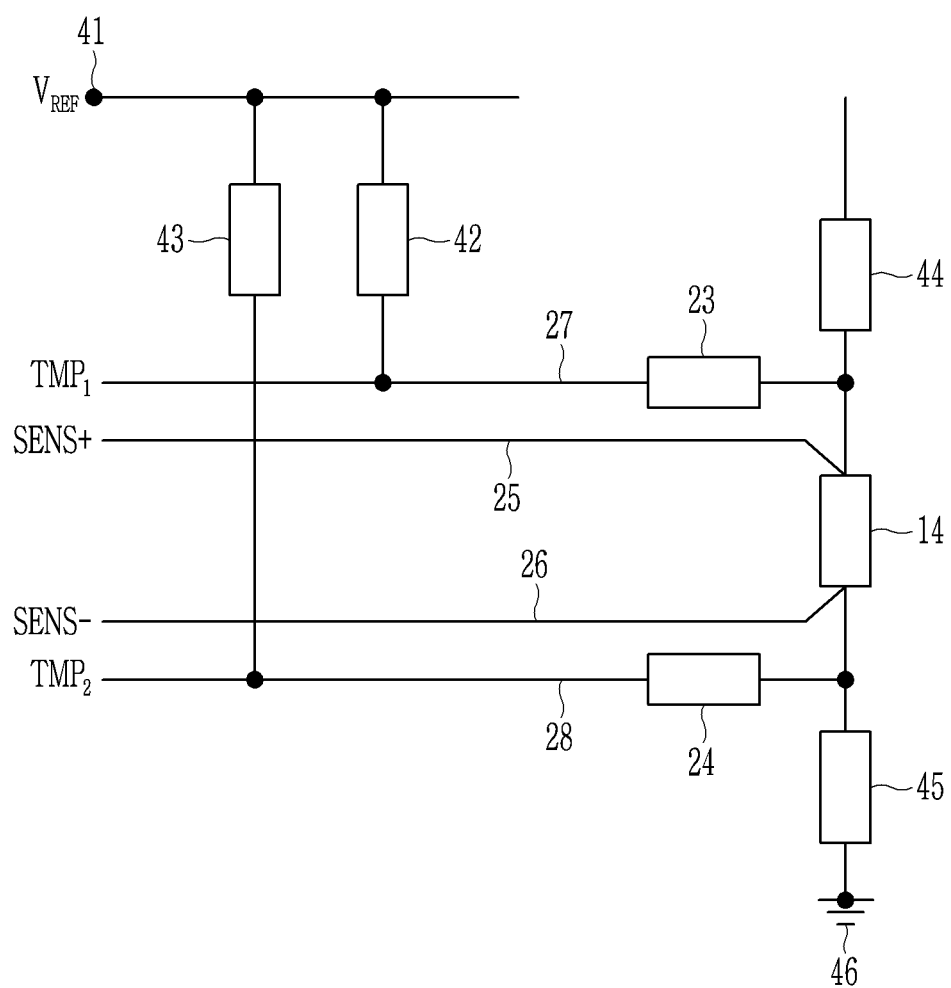
FIG. 5 illustrates a circuit diagram of a sensor system according to an embodiment.

According to the present embodiment, the first temperature sensor 23 is a first NTC thermistor, and the second temperature sensor 24 is a second NTC thermistor. In order to determine (e.g., to derive) the respective temperature signals via the first and second temperature sensors 23 and 24, a reference voltage is applied to the temperature sensors 23 and 24 as shown in FIG. 5. Further, each of the first and second temperature sensors 23 and 24 is connected to ground 44 via the shunt resistor 10. Thus, the temperature signals are determined by the reference voltage and the temperature-dependent resistance of the NTC thermistors 23 and 24.

Figure 4:
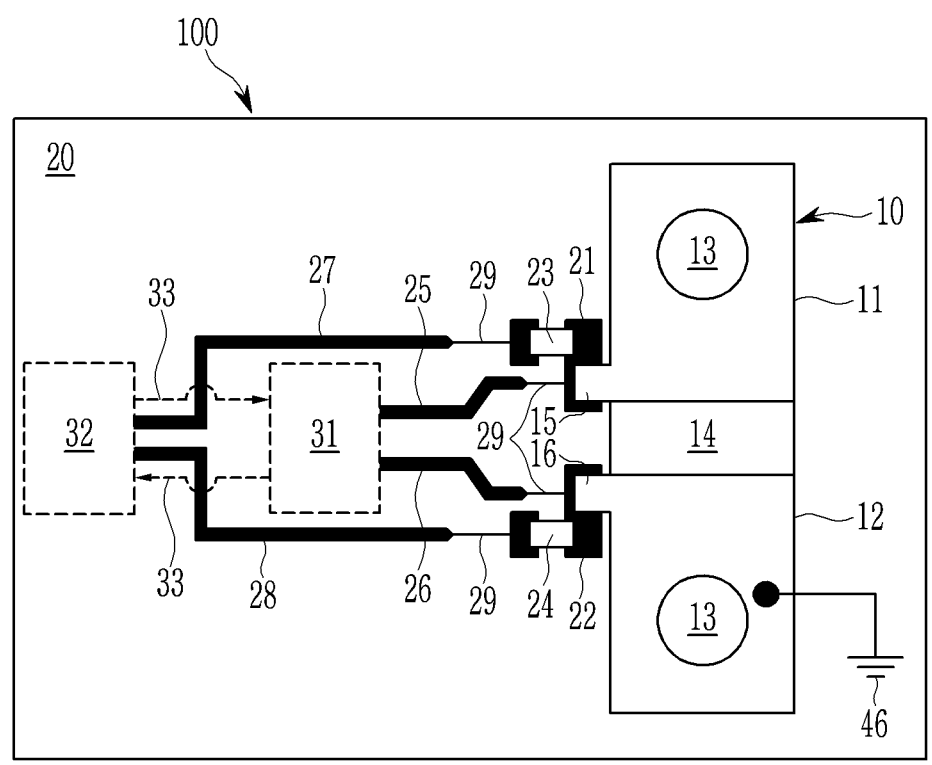
FIG. 4 schematically illustrates a sensor system according to another embodiment.

FIG. 4 schematically illustrates a sensor system 100 according to another embodiment. Referring to FIG. 4, the circuit carrier 20 further includes a voltage measurement circuit 31 connected to the first voltage sensing line 25 and the second voltage sensing line 26. The voltage measurement circuit 31 is configured to receive the first voltage signal via the first voltage sensing line 25, and to receive the second voltage signal via the second voltage sensing line 26. The voltage measurement circuit 31 is further configured to determine the voltage drop over the shunt resistor 10 based on the received first and second voltage signals. The voltage measurement circuit 31 may further be configured to determine the current through the shunt 10 based on the determined voltage drop and a stored value of the ohmic resistance of the measurement resistance 14. As would be known to those having ordinary skill in the arts, the voltage measurement circuit 31 may be implemented according to various different suitable designs, for example, such as those using analogue hardware components, for example, such as operational amplifiers, differential amplifiers, comparators, and/or the like, or those using integrated circuits, for example, such as application-specific integrated circuits (ASICs), programmable microcontrollers, and/or the like.

The sensor system 100 shown in FIG. 4 further includes a temperature measurement circuit 32 that is disposed on the circuit carrier 20, and that is configured to receive the first temperature signal via the first temperature sensing line 27, and to receive the second temperature signal via the second temperature sensing line 28. In the embodiment of FIG. 4, each of the first and second temperature sensing lines 27 and 28 also includes a local thinning portion 29 adjacent to the respective temperature sensor 23 and 24.

The temperature measurement circuit 32 is further configured to determine the temperature of the first landing pad 21 based on the received first temperature signal, and to determine the temperature of the second landing pad 22 based on the received second temperature signal. The voltage drop over the shunt resistor 10 based on the current along the current path of the battery module may influence the temperature determination due to the different reference voltages underlying the first and second temperature signals. Thus, the temperature measurement circuit 32 may be configured to communicate with the voltage measurement circuit 31 to exchange information. Further, the voltage measurement circuit 31 is configured to communicate with the temperature measurement circuit 32. The communication between the voltage measurement circuit 31 and the temperature measurement circuit 32 occurs via a data communication path 33 as indicated by dashed arrows illustrated in FIG. 4.

FIG. 5 illustrates a circuit diagram of a sensor system 100 according to an embodiment. The circuit diagram of FIG. 5 applies to the sensor systems 100 as schematically illustrated in FIGS. 3 and 4, and the same or substantially the same elements are denoted therein by the same reference signs. Accordingly, redundant description thereof may be simplified or may not be repeated. The sensor system 100 as shown in FIG. 5 includes the measurement resistance 14 that is disposed in a current path of a battery module. Further, a third resistor 44 and a fourth resistor 45 are disposed in the current path, and are connected in series with the shunt resistor, and thus, the measurement resistance 14. A first voltage signal SENS+ is tapped adjacent to the measurement resistance 14 via a first voltage sensing line 25, and a second voltage signal SENS− is tapped adjacent to the measurement resistance 14 via a second voltage sensing line 26. The voltage sensing lines 25 and 26 may provide the voltage signals SENS+ and SENS− to the voltage measurement circuit 31 as illustrated in FIG. 4.

A first NTC thermistor 23 as the first temperature sensor may contact the shunt resistor adjacent to the measurement resistance 14, for example, at a first voltage clamp as illustrated in each of the FIGS. 2 to 4. A reference voltage $V_{REF}$ (e.g., of 5 V) is applied to the first temperature sensor 23 from a reference voltage source 41 and via a first resistor 42 (e.g., of 10 kΩ). The reference voltage $V_{REF}$ is conducted via the measurement resistance 14 to ground 46. Due to the first resistor 42, an additional current over the shunt resistor due to the reference voltage may amount to 500 μA at the most. Further, a second NTC thermistor 24 as the second temperature sensor may contact the shunt resistor adjacent to the measurement resistance 14, for example, at a second voltage clamp as illustrated in each of the FIGS. 2 to 4. The reference voltage $V_{REF}$ (e.g., of 5 V) is applied to the second temperature sensor 24 from the reference voltage source 41 and via a second resistor 43 (e.g., of 10 kΩ). The reference voltage $V_{REF}$ is also conducted to ground 46. Thus, an additional current over the shunt resistor due to the reference voltage may amount to 500 μA at the most. The additional current due to the reference voltage $V_{REF}$ may thus be neglected in the current measurement via the shunt resistor. The voltage difference with respect to the first temperature signal on the first temperature sensing line 27 and the second temperature signal on the second temperature sensing line 28 are considered in calculating the temperature at the first temperature sensor 23 and the second temperature sensor 24, respectively. This voltage difference corresponds to the voltage drop over the measurement resistance 14 (e.g., V=SENS+−SENS−), which may be determined by a voltage measurement circuit 31 as illustrated in FIG. 4, and which may be communicated therefrom to a temperature measurement circuit 32 as illustrated in FIG. 4.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

REFERENCE SYMBOLS

10 shunt resistor
11 first current clamp
12 second current clamp
13 contact hole
14 measurement resistance
15 first voltage clamp
16 second voltage clamp
20 circuit carrier
21 first landing pad
22 second landing pad
23 first temperature sensor
24 second temperature sensor
25 first voltage sensing line
26 second voltage sensing line
27 first temperature sensing line
28 second temperature sensing line
31 voltage measurement circuit
32 temperature measurement circuit
33 communication lines
41 reference voltage node
42 first (dropping) resistor
43 second (dropping) resistor

What is claimed:

1. A sensor system for a battery module, comprising:
   a shunt resistor comprising:
      a first current clamp and a second current clamp, each of the first and second current clamps being configured to be connected to a current path of the battery module;
      a first voltage clamp protruding from the first current clamp and a second voltage clamp protruding from the second current clamp; and
      a measurement resistance between the first voltage clamp and the second voltage clamp, and electrically connected to the first current clamp and the second current clamp;
   a first landing pad electrically connected to the first voltage clamp;
   a second landing pad electrically connected to the second voltage clamp;
   a first temperature sensor connected to the first landing pad; and
   a second temperature sensor connected to the second landing pad,
   wherein the first current clamp and the second current clamp include a hole for being connected to column shaped terminals of a battery cell, and the first and second current clamps are connected to each other via the measurement resistance.

2. The sensor system of claim 1, wherein the measurement resistance comprises Manganin, Isotan, Constantan, and/or Isabellin.

3. The sensor system of claim 1, wherein the first and second current clamps and the first and second voltage clamps comprise copper or aluminum.

4. The sensor system of claim 1, further comprising:
   a circuit carrier configured to carry a controller of the battery module,
   wherein the first landing pad and the second landing pad are conductive structures on a surface of the circuit carrier,
   wherein the shunt resistor is on the surface of the circuit carrier, and
   wherein the first and second temperature sensors are surface mounted to the surface of the circuit carrier.

5. The sensor system of claim 4, wherein the circuit carrier is configured to carry at least one of a cell supervision circuit, a cell connecting unit, a battery management unit, or a battery management system.

6. The sensor system of claim 1, wherein the first temperature sensor is a first thermistor, and the second temperature sensor is a second thermistor.

7. The sensor system of claim 1, wherein the first current clamp is configured as a first bar element, the second current clamp is configured as a second bar element, and the measurement resistance is configured as a third bar element connected to the first bar element and the second bar element to form a common bar extending in a lengthwise direction.

8. The sensor system of claim 7, wherein the first voltage clamp is a first protrusion extending from the first bar element in a direction angled to the lengthwise direction, and the second voltage clamp is a second protrusion extending from the second bar element in a direction angled to the lengthwise direction.

9. The sensor system of claim 1, wherein:
   the first voltage clamp is connected to a first voltage sensing line via the first landing pad, and to a first temperature sensing line via the first landing pad and the first temperature sensor; and
   the second voltage clamp is connected to a second voltage sensing line via the second landing pad, and to a second temperature sensing line via the second landing pad and the second temperature sensor.

10. The sensor system of claim 9, wherein a thermal coupling between the first and second landing pads and at least one of the first and second voltage sensing lines or the first and second temperature sensing lines, respectively, is decreased.

11. The sensor system of claim 10, wherein at least one of the first and second voltage sensing lines or the first and second temperature sensing lines have a local thinning portion to decrease the thermal coupling.

12. The sensor system of claim 9, wherein the first and second voltage sensing lines are configured to provide voltage signals to a voltage measurement circuit, and wherein the first and second temperature sensing lines are configured to provide temperature signals to a temperature measurement circuit.

13. The sensor system of claim 12, wherein a reference voltage node is connected to the first temperature sensing line via a first resistor, and/or to the second temperature sensing line via a second resistor.

14. The sensor system of claim 12, wherein the voltage measurement circuit and the temperature measurement circuit are configured to communicate with each other.

15. The sensor system of claim 1, wherein the first current clamp is spaced from the second current clamp in a first direction with the measurement resistance therebetween,
  wherein the first voltage clamp protrudes from an edge of the first current clamp in a second direction crossing the first direction, and
  wherein the second voltage clamp protrudes from an edge of the second current clamp in the second direction.

* * * * *